United States Patent [19]

Tanizawa

[11] Patent Number: 4,739,250

[45] Date of Patent: Apr. 19, 1988

[54] SEMICONDUCTOR INTEGRATED CIRCUIT DEVICE WITH TEST CIRCUIT

[75] Inventor: Tetsu Tanizawa, Kawasaki, Japan

[73] Assignee: Fujitsu Limited, Kawasaki, Japan

[21] Appl. No.: 932,261

[22] Filed: Nov. 19, 1986

[30] Foreign Application Priority Data

Nov. 20, 1985 [JP] Japan ................ 60-258469
Nov. 20, 1985 [JP] Japan ................ 60-258472

[51] Int. Cl.$^4$ ........................... G01R 31/28
[52] U.S. Cl. ................ 324/73 R; 371/21; 371/25
[58] Field of Search ........... 324/73 R, 73 AT, 73 PC; 371/15, 20, 21, 25; 365/201

[56] References Cited

U.S. PATENT DOCUMENTS 3,958,110  5/1976  Hong et al. .................. 371/15
4,499,579  2/1985  Still et al. .................. 324/73 R

FOREIGN PATENT DOCUMENTS 61-42934  3/1986  Japan .

Primary Examiner—Ernest F. Karlsen
Attorney, Agent, or Firm—Staas & Halsey

[57] ABSTRACT

A semiconductor integrated circuit device with a test circuit including: a plurality of basic gate cells arranged in a matrix; wiring connected between the basic gate cells and arranged so as to constitute a logic circuit; and a test circuit for checking an operation state of each gate cell and a connection state between basic gate cells. The test circuit comprises: a test input section having a plurality of row selection wires provided along the basic gate cells in a row direction, a plurality of column selection wires provided along the basic gate cells in a column direction, and an access circuit connected to an input portion of the basic gate cell for applying an input signal to the basic gate cell optionally selected by the row and column selection wires; and a test direction section having a plurality of monitor wires provided along the basic gate cells in the row direction and a switching element connected between the basic gate cell and the monitor wire.

19 Claims, 9 Drawing Sheets

SEMICONDUCTOR INTEGRATED CIRCUIT DEVICE WITH TEST CIRCUIT

BACKGROUND OF THE INVENTION

1. Field of the Invention

The present invention relates to a semiconductor integrated circuit device with a test circuit, more particularly, to a gate array type large-scale integrated circuit (gate array LSI) having an improved test circuit.

2. Description of the Related Art

Recent research in the field of LSI testing has concentrated on the design of more effective test patterns using computer-aided-design (CAD) fault simulation and the design of more effective, simpler test circuits for incorporation in LSI's to allow testing by the scan pass method.

Testing by test patterns using CAD fault simulation, however, is disadvantageous in view of the long time required for the fault simulation program, which time is increasing in accordance with the increase in the scale of LSI's. Accordingly, testing by the incorporation of test circuits and the scan pass method is preferable. One of the better known scan pass methods now in use is the level sensitive scan design (LSSD) method of the IBM Corporation. Specifically, the logic circuit in the LSI is divided into combinational circuit portions and flip-flop circuit portions. The flip-flop circuits can be connected in series through switching circuits provided in those flip-flop circuits. When connected, the flip-flop circuits constitute a shift register. The test of the circuit is performed by switching between a "shift mode" and a "normal mode". In the shift mode, a scan signal is input to the shift register. In other words, data is applied to the shift register to set up the flip-flop circuits as a predetermined "1" or "0". The flip-flop circuits are then disconnected by the switching circuits and returned to the logic circuit. A predetermined logic operation is performed, and the flip-flop circuits then reconnected to form the shift register, after which the data of the shift register is read out and checked.

The above method has several problems; for example, the LSI must be designed to allow the formation of a shift register by the flip-flop circuits, and excessive signal lines must be provided to allow different types of LSI's to be checked. Also, since this method utilizes the logic circuit, the circuit test is dependent on the complexity of the LSI. This is because each gate state is set by the logic operation through external terminals of the LSI. Finally, this method requires a change in the design of the test circuit and the wiring thereof for each different type of LSI.

As one solution to the above problem, the following gate array LSI with a test circuit was proposed in Japanese Examined Patent Publication (Kokai) No. 61-42934 (corresponding to U.S. patent application Ser. No. 760,347). This prior art discloses a gate array LSI with a test circuit constituted by row selection wires provided along the gate cells in a row direction; column read-out wires provided along the gate cells in a column direction, row selection means for selecting any of the row selection wires and for selecting any of the gate cells connected to the selected row selection wire; column selection means for selecting and reading out the gate cells arranged in the logic circuit through the column read-out wire; and, switching means connected between the row selection wire and the output of the gate cell and being turned ON/OFF by the row selection means.

In this prior art, however, although it is possible to check the output of the gate cell using the switching means and row selection means, it is difficult to check an internal circuit of the gate cell because a test terminal is not provided at an input of the gate cell and the test is performed through the logic circuit. Accordingly, the test is dependent on the complexity of the logic circuit.

SUMMARY OF THE INVENTION

The primary object of the present invention is to provide a semiconductor integrated circuit device with an improved test circuit.

Another object of the present invention is to provide a gate array LSI with an improved test circuit enabling easy testing of the operation of not only the logic circuit, but also an internal circuit of the gate cell regardless of the complexity of the logic circuit.

In accordance with the present invention, there is provided a semiconductor integrated circuit device with a test circuit including: a plurality of basic gate cells arranged in a matrix; wiring connected between the basic gate cells so as to constitute a logic circuit; and a test circuit for checking an operation state of each gate cell and a connection state between basic gate cells, the test circuit comprising: a test input section having a plurality of row selection wires provided along the basic gate cells in a row direction, a plurality of column selection wires provided along the basic gate cells in a column direction, and an access circuit connected to an input portion of the basic gate cell for applying an input signal to the basic gate cell optionally selected by the row and column selection wires; and a test detection section having a plurality of monitor wires provided along the basic gate cells in the row direction and a switching element connected between the basic gate cell and the monitor wire.

There is also provided a semiconductor integrated circuit device with a test circuit including: a plurality of basic gate cells arranged in a matrix; wiring connected between the basic gate cells so as to constitute a logic circuit, the wiring being connected in such a way that interconnection between basic gate cells provided along the column direction is inhibited; and a test circuit for checking an operation state of each gate cell and a connection state between basic gate cells, the test circuit comprising: a test input section having a plurality of column selection wires provided along the basic gate cells in a column direction, and an access circuit connected to an input portion of the basic gate cell for applying an input signal to the basic gate cell optionally selected by the column selection wires; and a test detection section having a plurality of monitor wires provided along the basic gate cells in the row direction and a switching element connected between the basic gate cell and the monitor wire.

DESCRIPTION OF THE PREFERRED EMBODIMENTS

A semiconductor integrated circuit device with a test circuit according to the present invention will be explained in detail with reference to the drawings.

Figure 1:
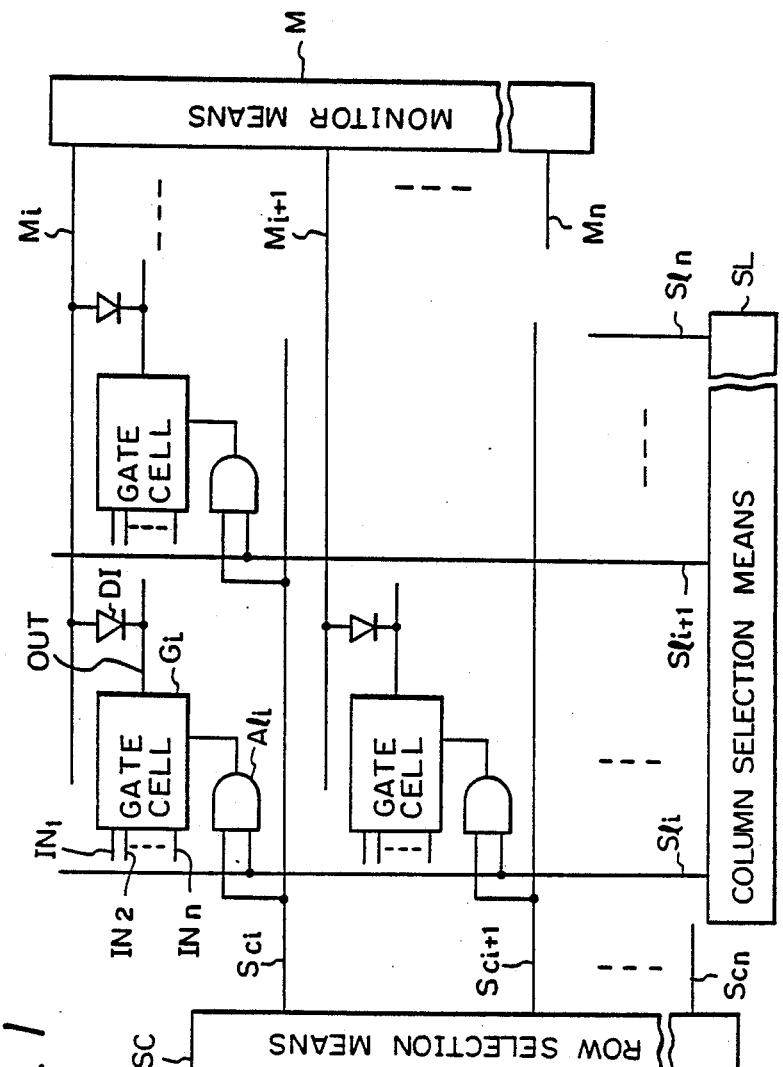
FIG. 1 is a schematic block diagram of a gate array LSI with a test circuit according to the present invention.

In FIG. 1, this circuit block shows a gate array LSI with the test circuit as the semiconductor integrated circuit device. The test circuit according to the present invention is basically constituted by test input means and test detection means. The test input means being comprised of a plurality of access means $Ali$, each of which is constituted by an AND gate circuit, row selection wires $Sci$, column selection wires $Sli$, a row selection means SC, a column selection means SL. The test detection means being comprised of monitor wires $Mi$, monitor means M, and switching means DI.

Although Gi is a basic gate cell constituted by either a NAND gate circuit or a NOR gate circuit, in this case, all basic gate cells are uniformly arranged in a matrix by either a NAND gate circuit or a NOR gate circuit. Each basic gate cell comprises a plurality of input terminals $IN_1$ to $IN_n$ and an output terminal OUT, and each input terminal is connected to the output terminal of the basic gate cell of the previous stage in order to obtain the desired logic operation. Accordingly, the desired logic circuit is constituted by interconnecting between each of the basic gate cells. Each of the access means $Ali$ consists of, for example, an AND gate; one input terminal of the AND gate being connected to the column selection wire, and the other input terminal of the AND gate being connected to the row selection wire. The output of the AND gate is connected to an input portion of the basic gate cell. Any one of the row selection wires $Sci$ to $Scn$ is selected by the row selection means SC when testing, and any one of the column selection wires $Sli$ to $Sln$ is selected by the column selection means SL when testing. Each of monitor wires $Mi$ to $Mn$ is connected to the monitor means M, and each of the basic gate cells is connected to the monitor wires $Mi$ to $Mn$ through the switching means (diode) DI. When the output of any of the basic gate cells becomes low level, the current flows from the monitor means M to the corresponding gate cell Gi through the monitor wire $Mi$ to $Mn$. Accordingly, the monitor wire $Mi$ to $Mn$ becomes low level. When the output becomes high level, the current does not flow in the monitor wire $Mi$ to $Mn$ and the monitor wire $Mi$ to $Mn$ is held at the high level. The low level or high level of the monitor wire $Mi$ to $Mn$ is checked by the monitor means M.

In the present invention, it is possible to forcibly determine an output level of the basic gate cell by using an access means, and the output level of the basic gate cell is then checked by the monitor means M for testing.

Figure 2:
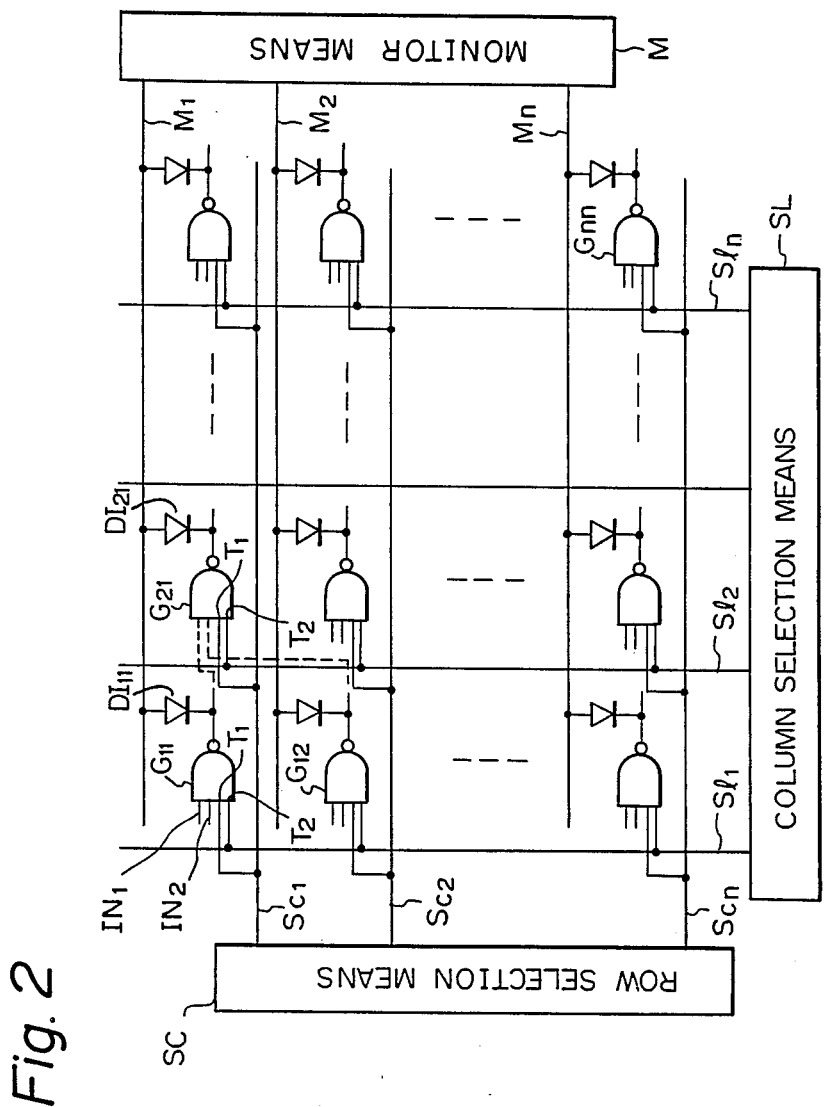
FIG. 2 is a schematic block diagram according to an embodiment of the present invention.

In FIG. 2, the basic gate cell Gi is shown in the case of a NAND gate. As shown in the drawing, this gate array LSI is constituted by a plurality of NAND gates as the logic circuit. As explained above, it is possible to use a NOR gate as the logic circuit to all basic gate cells instead of the NAND gate. Terminals $T_1$ and $T_2$ are input terminals of the access means. In this case, the access means is included in the NAND gate, as shown in detail in FIG. 5A. Accordingly, the terminals $T_1$ and $T_2$ are provided for each basic gate cell $G_{11}$ to $G_{nn}$ and used for the testing thereof. The terminal $T_1$ is connected to the row selection wire Sci and the terminal $T_2$ is connected to the column selection wire Sli. In this embodiment, the test circuit is constituted by a plurality of row selection wires $Sc_1$ to $Sc_n$, column selection wires $Sl_1$ to $Sl_n$, monitor wires $M_1$ to $M_n$, row selection means SC, column selection means SL, and a monitor means M.

The operation of the test circuit will be explained in detail hereinafter. In the test, there are four basic failure patterns; i.e., (1) output S0 failure, (2) output S1 failure, (3) input S0 failure, and (4) input S1 failure.

(1) The "output S0 failure" is detected when all row selection wires and column selection wires are low. Namely, when the test terminals $T_1$ and $T_2$ are low, the output of all NAND gates must be high if operating normally, because the output of the NAND gate is high when all input terminals thereof are not high. Accordingly, if the output of the NAND gate becomes low level, this low level is checked by the monitor means M through the diode DI, and is detected as an "output S0 failure". This failure can be detected at every row selection wire.

(2) The "output S1 failure" is detected when both of the test terminals $T_1$ and $T_2$ are high. That is, first, a row selection wire and a column selection wire are made high level. Accordingly, the selected test terminals $T_1$ and $T_2$ are high. Second, another row selection wire or column selection wire is made low level. Accordingly, other NAND gates must have a high level output, and these high levels are input to the selected NAND gate to be tested.

For example, assuming that the NAND gate cell $G_{21}$ is the gate to be tested. In this case, the row selection wire $Sc_1$ and column selection wire $Sl_2$ are made high level. Accordingly, the test terminals of the NAND gate cell $G_{21}$ are high. If the column selection wire $Sl_1$ is high, each output of the NAND gates $G_{11}$ and $G_{12}$ is high. Accordingly, both inputs of the NAND gate are high (through dotted lines in FIG. 2). In this case, if the NAND gate cell $G_{21}$ to be tested is normal, the output thereof becomes low level. This low level output is checked by the monitor means M through the diode DI and the monitor wire $M_1$, because the monitor wire $M_1$ has become low level since current flows from the monitor means M to the NAND gate cell $G_{21}$. If the monitor wire $M_1$ stays at a high level, the NAND gate cell $G_{21}$ is determined to be defective.

(3) The "input S0 failure" is detected when one of the input terminals of the NAND gate is low. That is, (as in Item 2), one of the input terminals of the NAND gate cell $G_{21}$ is not high caused by any failure. In this case, there are two types of failure pattern. First, the output of the NAND gate of the previous stage is not high, and second, the connection wire between the output terminal of the previous stage and the input terminal of the next stage has been shorted to the low level portion. In this case, since the output of the NAND gate cell $G_{21}$ becomes high level, this high level output is also determined to be a failure. In this pattern, since all inputs are high, the output is low if it is operating normally. If the output is high, any input is an "input S0 failure" or any output is an "output S1 failure" as shown in Item 2.

(4) The "input S1 failure" is detected when the output of the NAND gate cell, for example, $G_{11}$ of the previous stage, is forcibly changed from high level to low level. In this case, since one of the input of the NAND gate cell $G_{21}$ becomes low level, the output thereof is changed from low level to high level. This change of the output of the NAND gate cell $G_{21}$ is detected by the monitor means M.

Consequently, it is possible to test all NAND gate cells by using the above four "failure patterns". In this case, the test can be performed regardless of the logic operation of the logic circuit.

Figure 3:
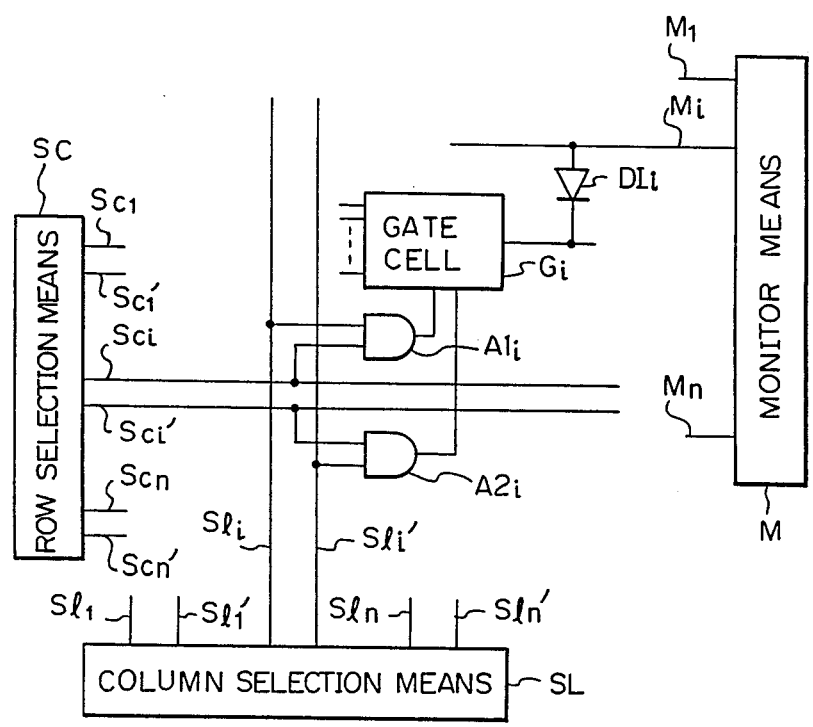
FIG. 3 is a schematic partial block diagram according to another embodiment of the present invention.

As shown in FIG. 3, an additional access means A2i is newly provided at the gate cell Gi. Moreover, additional row selection wires $Sc'$ to $Sc_n'$ are newly provided at the row selection means SC, and additional column selection wires $Sl_1'$ to $Sl_n'$ are also newly provided at the column selection means SL. The inputs of the first access means Ali are connected to the row selection wire Sci and the column selection wire Sli. The inputs of the second access means A2i are connected to the row selection wire Sci' and the column selection wire Sli'. By using the second access means A2i and additional row and column selection wires, it is possible to easily perform an "input S1 failure" detection, as explained in detail below.

Figure 4:
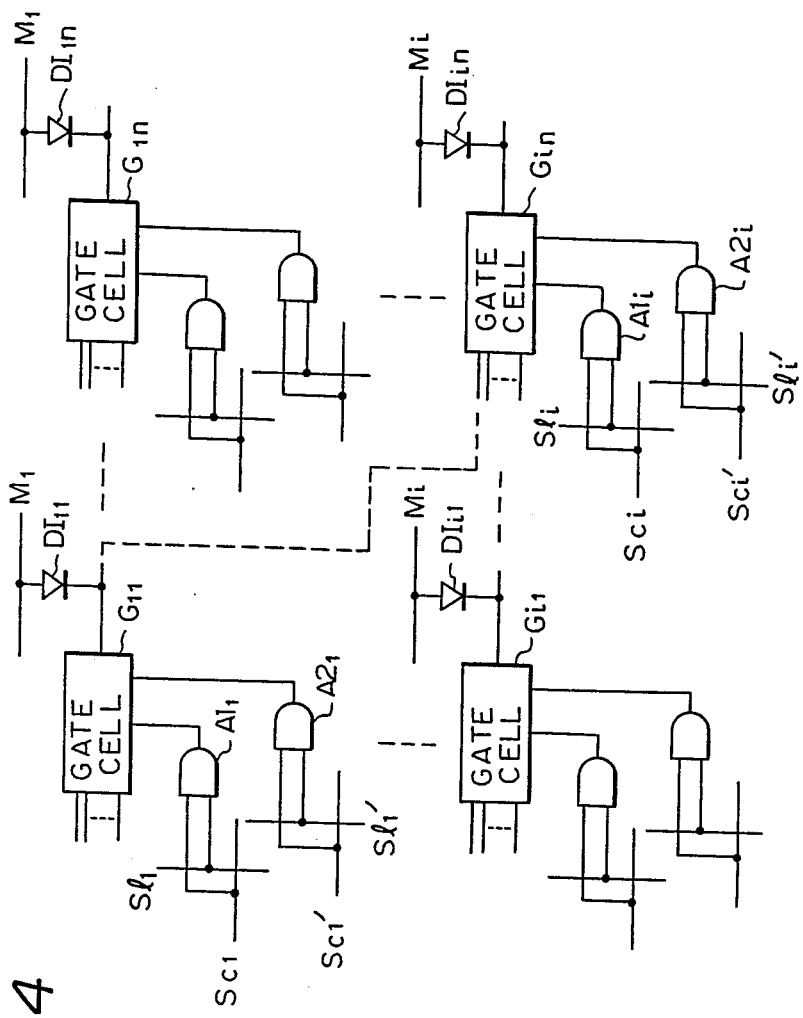
FIG. 4 is a schematic block diagram for explaining the second embodiment shown in FIG. 3.

In FIG. 4, assuming that the output of the gate cell $G_{11}$ is connected to the input of the gate cell $G_{in}$ as shown by the dotted line, then when both the row selection wire Sci and column selection wire sliare high and other row and column selection wires including $Sl_n'$ and $Sc_n'$ are set to a low level (i.e., only Sci and sliare high), the first access means Ali output is high level and the gate can be set to an enable state (this phenomenon is explained in FIG. 5). In this case, an expected value of the output level of the gate cell $G_{in}$ must be low if this gate cell is operating normally. The expected values of the output level of all gate cells except for $G_{in}$ are high because the gates lie in the test state of the "output S0 failure", and accordingly, these high level outputs are input to the input terminals of the gate cell $G_{in}$.

At this time, when both of the row selection wire $Sc_1'$ and the column selection wire $Sl_1'$ are set to low level, the output of the second access means $A2_1$ becomes high level, and thus the output of the gate cell $G_{11}$ is forcibly changed from high level to low level. This low level of the gate cell $G_{11}$ is input to the gate cell $G_{in}$, and thus the output of the gate cell $G_{in}$ is changed from low level to high level. This change of the output is checked by the monitor means M through the switching means $DI_{in}$ and the monitor wire Mi. Namely, if the output of the gate cell $G_{in}$ is changed, it is determined that at least the connection between the gate cell $G_{11}$ and the gate cell $G_{in}$ is normal.

Nevertheless, when the input of the gate cell $G_{in}$ remains low in spite of the low level of the output of the gate cell $G_{11}$, since the output of the gate cell $G_{in}$ has not changed, the connection failure can be detected by the monitor means M. Namely, this is regarded as an "input S1 failure".

As all gate cells are connected to the inputs of the gate cell $G_{in}$, when each second access means is sequentially selected and the output state thereof is forcibly changed from the high level to a low level, it is possible to test all connections between all gate cells connected to the gate cell $G_{in}$ and the input terminals of the gate cell $G_{in}$.

As can be understood from the above explanation, when detecting the above four failure patterns, the following procedures are carried out. Namely, in the first step, the first access means $Al_1$ to $Al_n$, the row selection wires $Sc_1$ to $Sc_n$, and the column selection wires $Sl_1$ to $Sl_n$ are used to detect the "output S0 failure", the "output S1 failure", and the "input S0 failure". In the second step, after these tests are completed, the second access means $A2_1$ to $A2_n$, the row selection wires $Sc_1'$ to $Sc_n'$ and the column selection wires $Sl_1'$ to $Sl_n'$ and detecting the "input S1 failure".

Figure 5A:
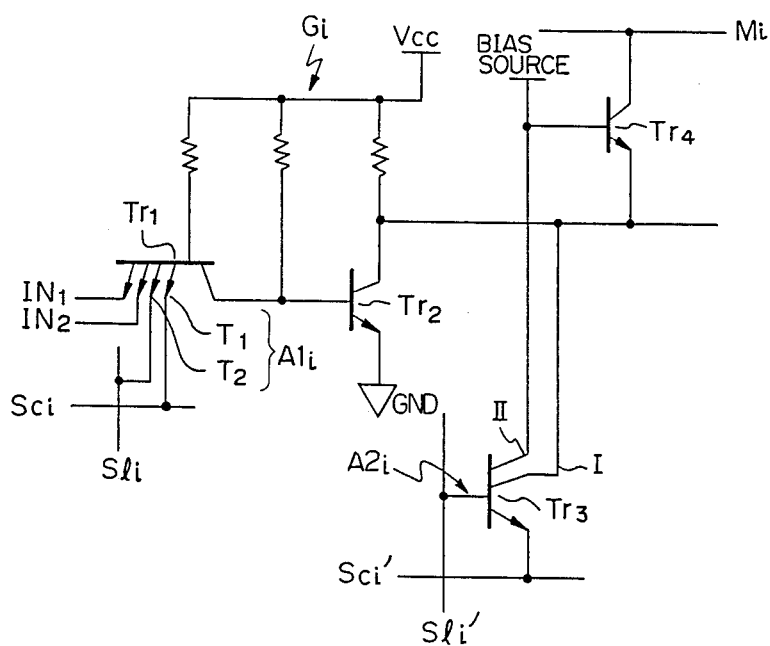
FIG. 5A is a circuit diagram of a 2-input NAND gate circuit including the first and second access means according to the present invention.

In FIG. 5A, Gi represents a 2-input NAND gate having the first access means Ali and the second access means A2i, and $Tr_1$ represents a multi-emitter transistor having four emitters. The input terminals $IN_1$ and $IN_2$ are connected to the output terminals of the NAND gates at the previous stage. The terminals $T_1$ and $T_2$ are the test terminals. Accordingly, the access means Ali is constituted by the emitters connected to the test terminals $T_1$ and $T_2$. The terminal $T_1$ is connected to the row selection wire Sci and the terminal $T_2$ is connected to the column selection wire Sli. The second access mean A2i is constituted by the base of the transistor $Tr_3$. In this case, the base is connected to the column selection wire Sli'; the emitter of the transistor $Tr_3$ is connected to the row selection wire Sci'; and, the output terminal OUT is connected to the input terminal of the NAND gate of the next stage.

When either the row selection wire Sci or the column selection wire sli is low, the transistor $Tr_1$ is turned ON. In this case, whether the input terminals $IN_1$ and $IN_2$ are high or low has no effect on the turning ON/OFF of the transistor $Tr_1$. When the transistor $Tr_1$ is turned ON, the output transistor $Tr_2$ is turned OFF and the output becomes high level, and when all input terminals are high, the transistor $Tr_2$ is turned ON and the output becomes low level.

In the high level state of the output, when the column selection wire Sli' is made high level and the row selection wire Sci' is made low level, the multi-collector transistor $Tr_3$ is turned ON because the base (the second access means A2i) becomes high level. When the transistor $Tr_3$ is turned ON, i.e., the access means A2i is selected, the high level of the output is changed to a low level because the first collector I of the transistor $Tr_3$ is connected to the output terminal OUT. As explained above, the output state of the NAND gate can be changed in response to the high or low level of the row and column selection wires Sci' and Sli'. The second collector II of the transistor $Tr_3$ is connected to an appropriate bias source. The transistor $Tr_4$ is connected between the monitor wire Mi and the output terminal OUT. This transistor $Tr_4$ is used instead of the diode DI. When the transistor $Tr_3$ is turned ON, the current flows from the bias source to the second collector II so that the base of the transistor $Tr_4$ becomes low level, and thus the transistor $Tr_4$ is turned OFF. Accordingly, the level change of the output has no influence on the monitor Mi. That is, when the output level is changed from high level to low level by the second access means A2i, this low level of the output is not detected by the monitor means M through the monitor wire Mi.

Figure 5B:
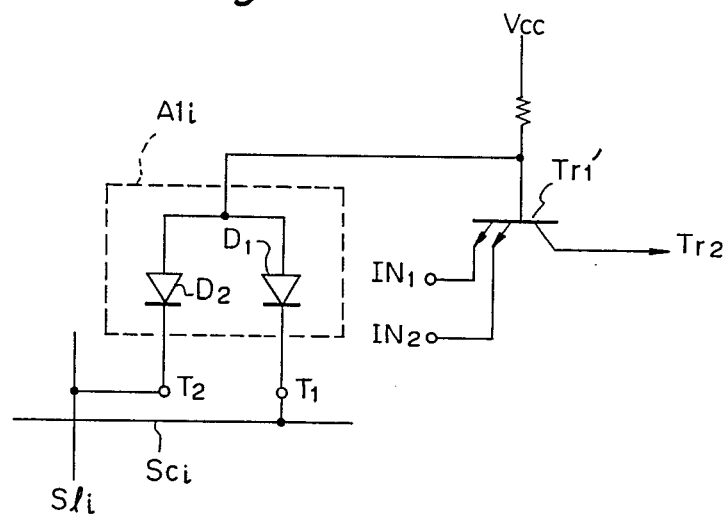
FIGS. 5B and 5C are circuit diagrams of the first access means according to another embodiment of the present invention.

In FIG. 5B, the input transistor $Tr_1'$ corresponds to the input transistor $Tr_1$ shown in FIG. 5A. The first access means Ali is constituted by diodes $D_1$ and $D_2$. The terminals $T_1$ and $T_2$ are used as the test terminals. The test terminal $T_1$ is connected to the row selection wire Sci and the test terminal $T_2$ is connected to the column selection wire Sli. The diodes $D_1$ and $D_2$ are connected in the direction as shown in the drawing.

Figure 5C:
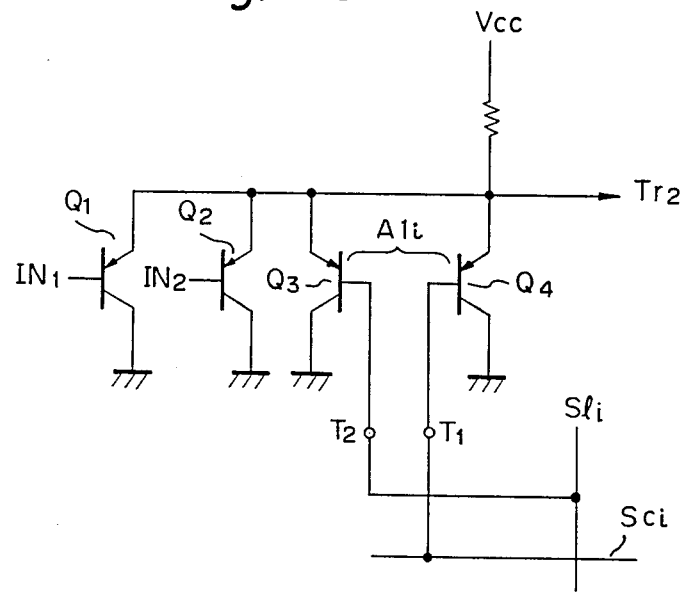

In FIG. 5C, a plurality of input PNP-type transistors $Q_1$ to $Q_4$ correspond to the input transistor $Tr_1$ shown in FIG. 5A. Each emitter of the input transistor is connected to the transistor $Tr_2$ and each collector thereof is connected to the ground. The logic input signal is input to each base of the transistors $Q_1$ and $Q_2$. The first access means Ali is constituted by each base of the transistors $Q_3$ and $Q_4$. The test terminal $T_1$ is connected to the row selection wire Sci and the test terminal $T_2$ is connected to the column selection wire Sli.

Figure 6:
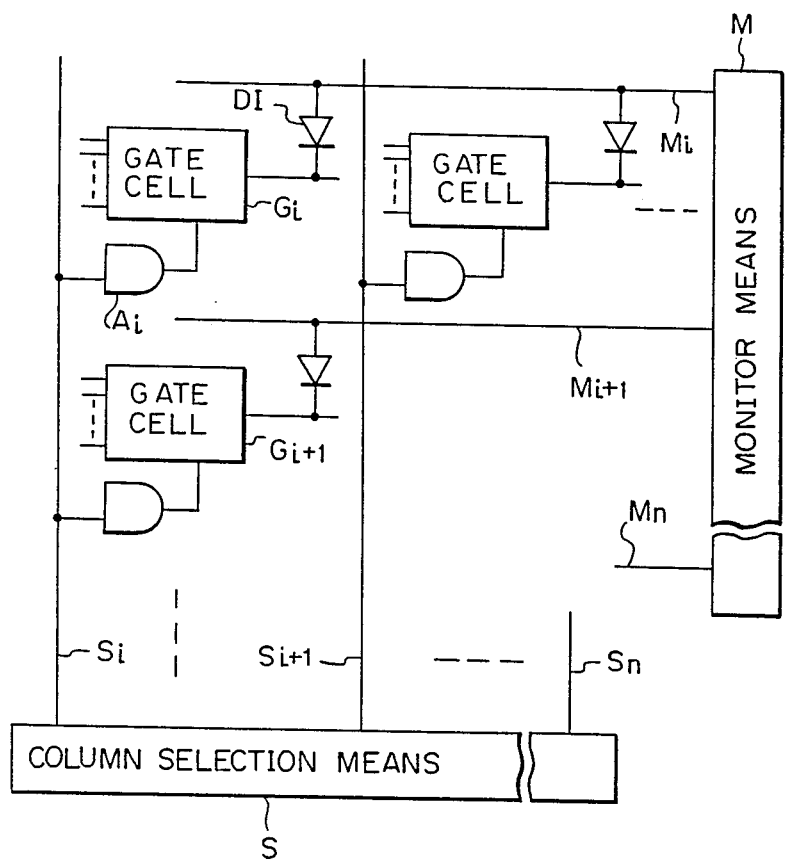
FIG. 6 is a schematic block diagram according to still another embodiment of the present invention.

In FIG. 6, Ai represents an access means. In this embodiment, the row selection means and the row selection wires are omitted from the test circuit of the first and second embodiments. Accordingly, the test circuit of this embodiment is constituted by column selection wires Si to Sn, monitor wires Mi to Mn, diodes DI, a column selection means S, and the monitor means M. The input terminal of the access means Ai is connected to the column selection wire Si and the output thereof is connected to the gate cell Gi.

Figure 7:
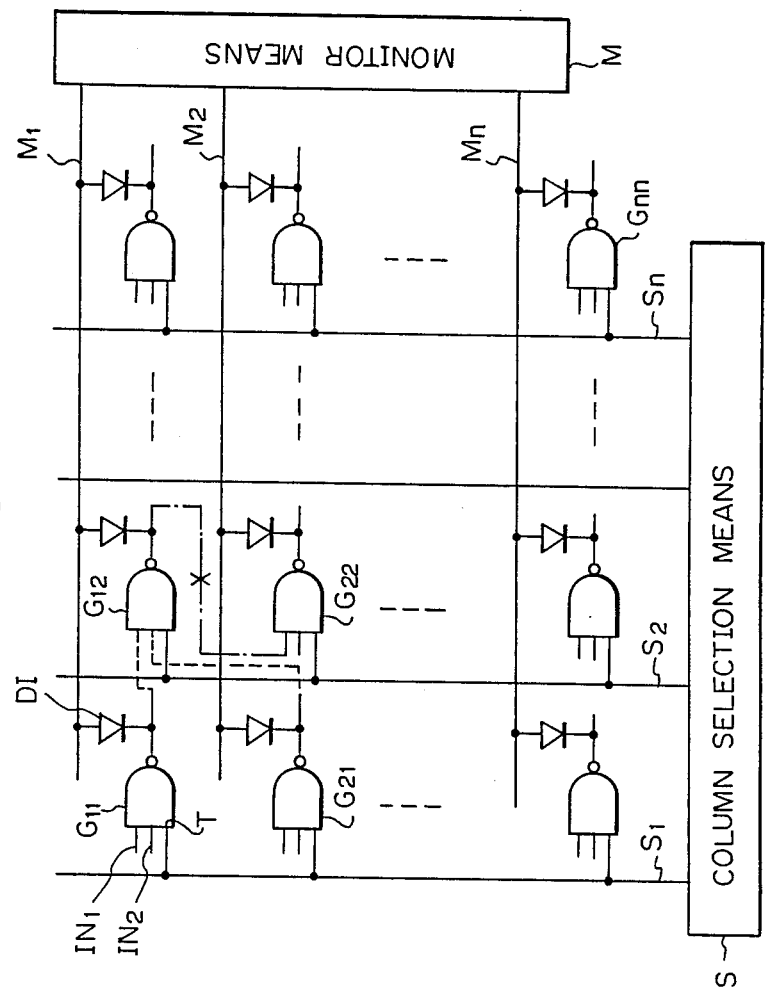
FIG. 7 is a schematic block diagram for explaining the third embodiment shown in FIG. 6; and, FIG. 8 is a circuit diagram of another 2-input NAND gate circuit including the access means according to the present invention.

In FIG. 7, $G_{11}$ to $G_{nn}$ represent NAND gates, each of which includes the access means. T is the input terminal for the access means used as a test terminal. These gate cells can be also constituted by NOR gates, as explained in the first and second embodiment.

When testing the logic circuit, three failure patterns are used in this embodiment, i.e., "output S0 failure", "output S1 failure", and "input S0 failure".

In the detection of the "output S0 failure", all column selection wires $S_1$ to $S_n$ are made low level. Accordingly, all outputs of the NAND gates are expected to be high level. If any output of the NAND gate is low, this low level output is detected by the monitor means M through the diode and monitor wire.

In the detection of the "output S1 failure", each column selection wire $S_1$ to $S_n$ is sequentially set to a high level. In this case, the input terminals of all NAND gates belonging to the selected column selection wire are high. Accordingly, the output terminals of the above-mentioned NAND gates must be low if operating normally. If any of the output levels of the NAND gate are high, this high level is detected by the monitor means M, as a failure of the gate cell, through the diode and the monitor wire.

In the detection of the "input S0 failure", this case is similar to the "output S1 failure" regarding the high level detection by the monitor means M. But, in this case, the input terminals become low level if there is a failure of the connection between the previous stage and the next stage.

In this embodiment, however, it is necessary to provide special wiring conditions when designing the logic circuit. That is, the connection is inhibited between each of the gate cells provided on the same column selection wire. For example, as shown by the chain dotted line and "X" mark in FIG. 7, the connection between the output of the NAND gate $G_{12}$ and the input of the NAND gate $G_{22}$ is inhibited because the NAND gates $G_{12}$ and $G_{22}$ are provided on the column selection wire $S_2$. It is possible to detect the "output S0 failure", "output S1 failure" and "input S0 failure" based on this wiring condition.

In this embodiment, although there are some conditions regarding the wiring pattern of the logic circuit, it is possible to reduce the cost of the test circuit because the row selection means and the row selection wires are omitted from the test circuit.

Figure 8:
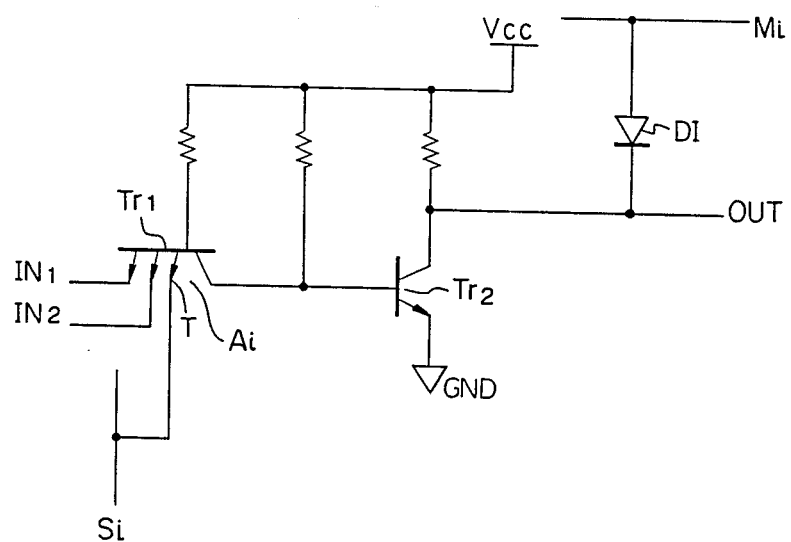

FIG. 8 shows a 2-input NAND gate circuit. Here, $Tr_1$ is the input multi-emitter transistor and $Tr_2$ is the output transistor; T is the test terminal and is connected to the column selection wire Si; and the access means Ai is constituted by the emitter of the transistor $Tr_1$.

When the column selection wire Si is low, the transistor $Tr_1$ is turned ON and the transistor $Tr_2$ is turned OFF. Accordingly, the output becomes high level. Conversely, when either the column selection wire Si is high or both inputs $IN_1$ and $IN_2$ are high, the output becomes low level. In all drawings, $V_{CC}$ represents the first power source (usually, positive side) and GND represents the second power source (usually, negative side).

Moreover, as the row selection means and the column selection means, it is possible to use a conventional ring counter having flip-flop circuits. As the monitor means, it is also possible to use a conventional shift register. Therefore, explanations in detail of the structures of these means are omitted in this specification.

Although the explanations are concerned with only a NAND gate circuit as the basic gate cell, in the specification, if a NOR gate circuit is used as the basic gate cell, all diodes (switching means) must be connected between the monitor wire and the basic gate cell in the reverse direction. Moreover, it is necessary to set reverse levels (high→low, low→high) in the row and column selection wires in comparison with the case of the NAND gate circuit.

I claim:

1. A semiconductor integrated circuit device with a test circuit comprising:
    a plurality of basic gate cells arranged in a matrix;
    wiring-means connected between said basic gate cells so as to constitute a logic circuit; and
    a test circuit for checking an operation state of each gate cell and a connection state between basic gate cells, said test circuit comprising: a test input means having a plurality of row selection wires provided along said basic gate cells in a row direction, a plurality of column selection wires provided along said basic gate cells in a column direction, and access means connected to an input portion of said basic gate cell for applying an input signal to said basic gate cell optionally selected by said row and column selection wires; and a test detection means having a plurality of monitor wires provided along said basic gate cells in the row direction and a switching means connected between said basic gate cell and said monitor wire.

2. A semiconductor integrated circuit device with a test circuit as claimed in claim 1, wherein said test circuit further comprises: row selection means, operatively connected to said row selection wires, for selecting any of said row selection wires; column selection means, operatively connected to said column selection wires, for selecting any of said column selection wires; and monitor means, operatively connected to said monitor wires, for detecting levels of said monitor wires.

3. A semiconductor integrated circuit device with a test circuit as claimed in claim 1, wherein said test input means further comprises: a plurality of additional row selection wires provided along said basic gate cells in the row direction, each of said basic gate cells being operatively connected to said additional row selection wire; a plurality of additional column selection wires provided along said basic gate cells in the column direction, each of said basic gate cells being operatively connected to said additional column selection wire; and additional access means having input terminals connected to said additional row selection wire and said additional column selection wire, and an output terminal connected to said gate cell.

4. A semiconductor integrated circuit device with a test circuit as claimed in claim 1, wherein said basic gate cell comprises a NAND gate or a NOR gate circuit.

5. A semiconductor integrated circuit device with a test circuit as claimed in claim 1, wherein said access means is constituted by at least one emitter of an input multi-emitter transistor in said NAND gate circuit.

6. A semiconductor integrated circuit device with a test circuit as claimed in claim 1, wherein said access means is constituted by at least one diode connected to a base of said input multi-emitter transistor in said NAND gate circuit.

7. A semiconductor integrated circuit device with a test circuit as claimed in claim 1, wherein said access means is constituted by at least one base of an input PNP-type transistor in said NAND gate circuit.

8. A semiconductor integrated circuit device with a test circuit as claimed in claim 1, wherein said switching means comprises a diode.

9. A semiconductor integrated circuit device with a test circuit as claimed in claim 1, wherein said switching means comprises a transistor.

10. A semiconductor integrated circuit device with a test circuit as claimed in claim 3, wherein said additional access means is constituted by a base of a multi-collector transistor connected to said NAND gate circuit.

11. A semiconductor integrated circuit device with a test circuit as claimed in claim 1, wherein said access means can set said basic gate cell to an enabling state.

12. A semiconductor integrated circuit device with a test circuit as claimed in claim 3, wherein said additional access means can forcibly set the output of said basic gate cell to either a low or a high level, i.e., when the NAND gate is used, the level is low, and when the NOR gate is used, the level is high, and can disconnect from said monitor wire.

13. A semiconductor integrated circuit device with a test circuit comprising:
a plurality of basic gate cells arranged in a matrix;
wiring means connected between said basic gate cells so as to constitute a logic circuit, said wiring means being arranged so as to inhibit interconnection between basic gate cells provided along a column direction; and
a test circuit for checking an operation state of each gate cell and a connection state between basic gate cells, said test circuit comprising: a test input means having a plurality of column selection wires provided along said basic gate cells in a column direction, and access means connected to an input portion of said basic gate cell for applying an input signal to said basic gate cell optionally selected by said column selection wires; and a test detection means having a plurality of monitor wires provided along said basic gate cells in the row direction and a switching means connected between said basic gate cell and said monitor wire.

14. A semiconductor integrated circuit device with a test circuit as claimed in claim 13, wherein said test circuit further comprises: column selection means, operatively connected to said column selection wires, for selecting any of said column selection wires, and monitor means, operatively connected to said monitor wires, for detecting a level of said monitor wire.

15. A semiconductor integrated circuit device with a test circuit as claimed in claim 4, wherein said access means is constituted by at least one emitter of an input multiemitter transistor in said NAND gate circuit.

16. A semiconductor integrated circuit device with a test circuit as claimed in claim 4, wherein said access means is constituted by at least one diode connected to a base of said input multi-emitter transistor in said NAND gate circuit.

17. A semiconductor integrated circuit device with a test circuit as claimed in claim 5, wherein said access means is constituted by at least one diode connected to a base of said input multi-emitter transistor in said NAND gate circuit.

18. A semiconductor integrated circuit device with a test circuit as claimed in claim 4, wherein said access means is constituted by at least one base of an input PNP-type transistor in said NAND gate circuit.

19. A semiconductor integrated circuit device with a test circuit as claimed in claim 4, wheren said additional access means is constituted by a base of a multi-collector transistor connected to said NAND gate circuit.

* * * * *

UNITED STATES PATENT AND TRADEMARK OFFICE
CERTIFICATE OF CORRECTION

PATENT NO. : 4,739,250
DATED : APRIL 19, 1988
INVENTOR(S) : TETSU TANIZAWA

It is certified that error appears in the above-identified patent and that said Letters Patent is hereby corrected as shown below:

Col. 5, line 22, "Sc'" should be --$Sc_1'$--;

line 37, "sliare" should be --Sli are--;

line 39, "sliare" should be --Sli are--.

Col. 6, line 18, "and" should be --are used for--;

line 29, "mean" should be --means--;

line 38, "sli" should be --Sli--.

Col. 10, line 32, "multiemitter" should be --multi-emitter--.

Signed and Sealed this

Sixteenth Day of August, 1988

Attest:

DONALD J. QUIGG

*Attesting Officer*        *Commissioner of Patents and Trademarks*